US011955194B2

(12) United States Patent
Sheperek et al.

(10) Patent No.: US 11,955,194 B2
(45) Date of Patent: Apr. 9, 2024

(54) TRACKING AND REFRESHING STATE METRICS IN MEMORY SUB-SYSTEMS

(71) Applicant: Micron Technology, Inc., Boise, ID (US)

(72) Inventors: Michael Sheperek, Longmont, CO (US); Bruce A. Liikanen, Berthoud, CO (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/133,103

(22) Filed: Apr. 11, 2023

(65) Prior Publication Data

US 2023/0245708 A1    Aug. 3, 2023

Related U.S. Application Data

(63) Continuation of application No. 17/301,350, filed on Mar. 31, 2021, now Pat. No. 11,636,913.

(60) Provisional application No. 62/706,462, filed on Aug. 18, 2020.

(51) Int. Cl.
| | |
|---|---|
| *G11C 16/16* | (2006.01) |
| *G11C 16/26* | (2006.01) |
| *G11C 29/12* | (2006.01) |
| *G11C 29/42* | (2006.01) |
| *G11C 29/44* | (2006.01) |

(52) U.S. Cl.
CPC .............. *G11C 29/42* (2013.01); *G11C 16/16* (2013.01); *G11C 16/26* (2013.01); *G11C 29/12015* (2013.01); *G11C 29/44* (2013.01); *G11C 2207/2254* (2013.01)

(58) Field of Classification Search
CPC ......... G11C 29/42; G11C 16/16; G11C 16/26; G11C 29/12015; G11C 29/44; G11C 2207/2254; G11C 2029/0409; G11C 29/021; G11C 16/32; G11C 11/5642; G11C 16/349; G11C 29/028; G11C 16/3418
See application file for complete search history.

(56) References Cited

U.S. PATENT DOCUMENTS

| | | | |
|---|---|---|---|
| 2019/0066739 A1 | 2/2019 | Muchherla et al. | |
| 2019/0066802 A1* | 2/2019 | Malshe | ................. G11C 16/26 |
| 2021/0166774 A1 | 6/2021 | Cah et al. | |

\* cited by examiner

*Primary Examiner* — Xiaochun L Chen
(74) *Attorney, Agent, or Firm* — Lowenstein Sandler LLP

(57) ABSTRACT

Disclosed is a system that comprises a memory device and a processing device, operatively coupled with the memory device, to perform operations that include, responsive to detecting a triggering event, selecting a family of memory blocks of the memory device, the selected family being associated with a set of bins, each bin associated with a plurality of read voltage offsets to be applied to base read voltages during read operations. The operations performed by the processing device further include calibration operations to determine data state metric values characterizing application of read voltage offsets of various bins. The operations performed by the processing device further include identifying, based on the determined data state metrics, a target bin and associating the selected family with the target bin.

20 Claims, 7 Drawing Sheets

TRACKING AND REFRESHING STATE METRICS IN MEMORY SUB-SYSTEMS

RELATED APPLICATIONS

This application is a continuation application of co-pending U.S. patent application Ser. No. 17/301,350, filed Mar. 31, 2021, which claims the benefit of U.S. Provisional Patent Application No. 62/706,462, filed Aug. 18, 2020, the entire contents of which are incorporated herein by reference.

TECHNICAL FIELD

Embodiments of the disclosure relate generally to memory sub-systems, and more specifically, relate to tracking and refreshing state metrics in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
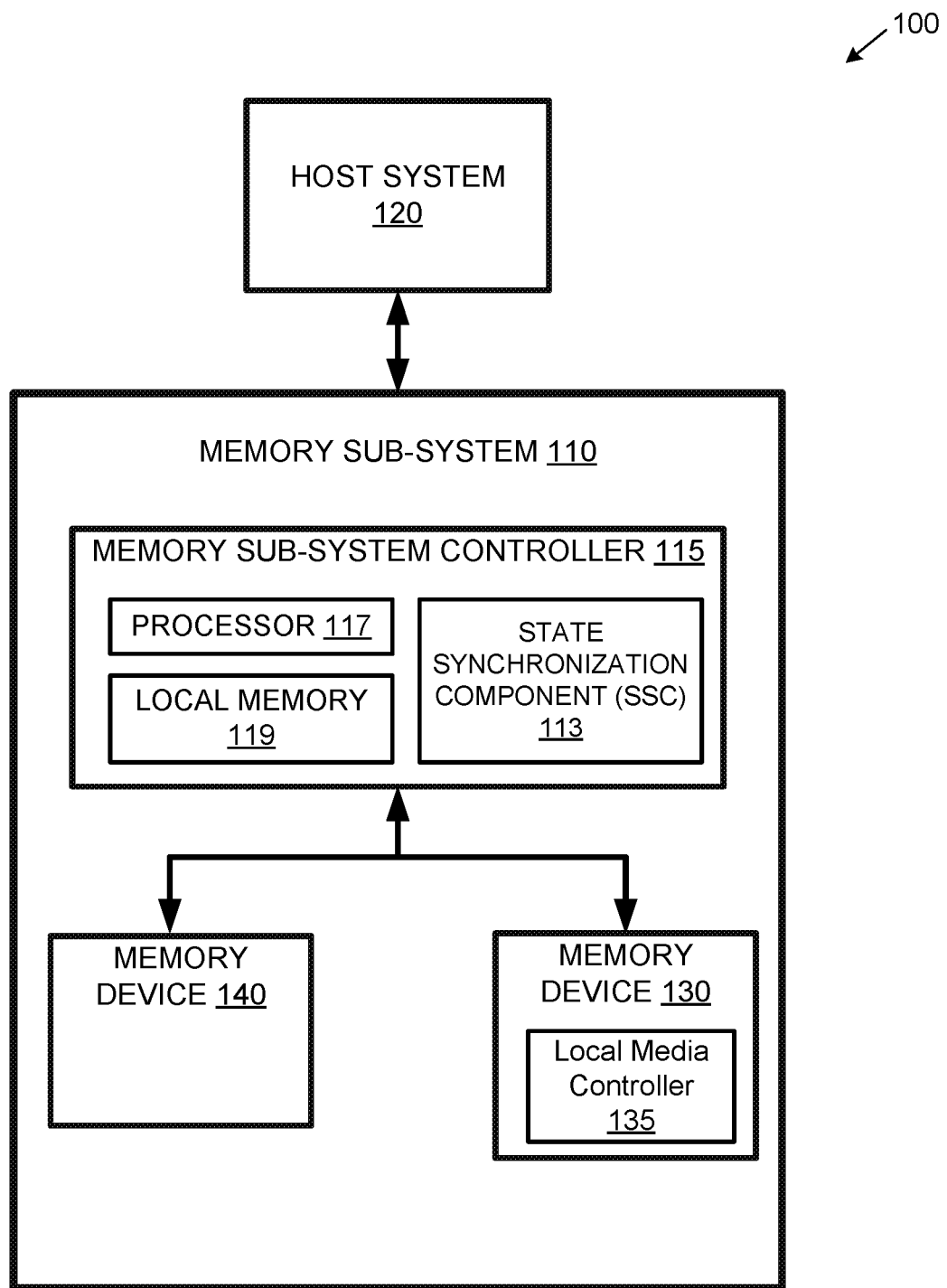
FIG. 1 illustrates an example computing system that includes a memory sub-system in accordance with some embodiments of the present disclosure.

Aspects of the present disclosure are directed to tracking and refreshing state metrics in memory sub-systems. A memory sub-system can be a storage device, a memory module, or a hybrid of a storage device and a memory module. Examples of storage devices and memory modules are described below in conjunction with FIG. 1. In general, a host system can utilize a memory sub-system that includes one or more memory components, such as memory devices that store data. The host system can provide data to be stored by the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, thus determining a voltage signal $V_{CG}$ that has to be applied to a control electrode of the cell to open the cell to the flow of electric current across the cell, between the source electrode and the drain electrode. More specifically, for each individual memory cell (having a charge Q stored thereon) there can be a threshold control gate voltage $V_T$ (herein also referred to as the "threshold voltage" or simply as "threshold") such that for $V_{CG}<V_T$ the source-drain electric current is low. The current increases substantially once the control gate voltage has exceeded the threshold voltage, $V_{CG}>V_T$. Because the actual geometry of the electrodes and gates varies from cell to cell, the threshold voltages $V_T$ can be different even for cells implemented on the same die. The memory cells can, therefore, be characterized by a distribution P of the threshold voltages, $P(Q, V_T) = dW/dV_T$, where dW represents the probability that any given cell has its threshold voltage within the interval $[V_T, V_T+dV_T]$ when charge Q is placed on the cell.

A high-quality memory device can have distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing storing and reliably detecting multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels (read levels) corresponding to known valley margins (e.g., centers of the margins) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). TVS can include different components such as intrinsic charge loss, system charge loss, quick charge loss, etc. TVS is generally increased with increasing number of by Program Erase Cycles (PEC), higher temperatures, and higher program voltages. TVS can show significant die-to-die variation.

Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately power-law fashion, $\Delta V_T(t) = -C * t^b$, with respect to the time t elapsed since the cell programming event, referred herein as Time After Program (TAP). TAP can be estimated (e.g., inferred from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice may be referenced by its center point (e.g., 10 minutes). In some embodiments of the present disclosure, TVS can be mitigated by keeping track of TAP as well as of the environmental conditions of a particular memory partition (block, plane, etc.) and associating a voltage offset $\Delta V_T$ to be used during read operations, where the standard "base read level" threshold voltage $V_T$ (displayed by the cell immediately after programing) is modified by the voltage offset: $V_T V_T + \Delta V_T$. Whereas TVS is a continuous process and the compensating correction $\Delta V_T(t)$ can be a continuous function of time, adequate accuracy of offsets can be achieved in some embodiments with a discrete number of offset "bins." Each bin can be associated with "families" of blocks (or any other memory partitions) programmed within a specified time window and under similar environmental (e.g., temperature) conditions. As the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any combination of these.

Block Family Creation is the process of opening a block family, maintaining that open block family for a duration, and then closing that block family. Opening a block family starts the Open Block Family Tenure, a time during which the drive may write data to the block family or my read data from the block family. Closing a block family starts the Closed Block Family Tenure, a time during which the drive may read data from the block family but not write data to the block family. Invalidating the block family starts the Invalid Block Family Tenure, a time during which the block family contains no data which has not been rendered invalid, normally through garbage collection. The open block family tenure and the closed block family tenure together are the Block Family Tenure.

In an illustrative example, a new block family can be created ("opened") whenever a specified period of time Δt (e.g., a predetermined number of minutes) has elapsed since the creation of the last block family or whenever the reference temperature of memory cells has changed by more than a specified threshold temperature ΔΘ (e.g. 10K, 5K, or any other value). Similarly, the family can be "closed" (and a new family can be created) after the time Δt has elapsed since the family was created or if the reference temperature has changed (in either direction) by more than ΔΘ. A memory sub-system controller can maintain an identifier of the active block family, which is associated with one or more blocks as they are being programmed.

The memory sub-system controller can periodically perform a calibration process in order to associate partitions of various families with one of the bins. Each bin, in turn, can be associated with a set of the voltage offsets to be applied for read operations. The associations of partitions with families and families with bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions (pages, blocks, planes, dies, etc.) that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can (1) identify the family associated with the memory partition referenced by the logical address specified in the read command, (2) identify the current bin associated with the identified family, (3) determine a plurality of read offsets for the identified bin, (4) compute the new read voltages by additively applying the read offsets associated with the identified bin to the base read levels, and (5) perform the read operation using the new read voltage, as described in more detail below.

Immediately after programming, a memory partition can be associated with bin 0 (or any other default bin) whose read offsets are small (or even zero, in some embodiments). With the passage of time, the amount of charge on the programmed memory cells can begin to decrease (e.g., due to quantum tunneling of electrons from the floating gates of the memory cells) and the target offsets for reliable read operations can begin to change accordingly—a lesser amount of charge on the floating gate requiring a smaller gate voltage to render a cell conducting. From testing a number of memory devices, an approximate dependence of the read offsets with time elapsed after programming can be determined. The determined approximate dependence is referred to as the TVS function and can be a continuous function of time (determined separately for each possible logical state of the memory cell) and can serve as a benchmark curve for determining read offsets to be applied in read operations. The younger portion of the TVS function(s) is the portion corresponding to small TAP. The older portion of the TVS function(s) is the portion corresponding to a large TAP. The TVS function(s) can additionally vary on other variables (e.g., temperature, number of program erase cycles, data state metric chosen, etc.

In practice, instead of determining the read offsets in a continuous manner, it can be faster and computationally more efficient to maintain a discrete set of bins, e.g., bins 0 . . . M. Each bin can be associated with pre-determined read offsets $\Delta V_1$ . . . $\Delta V_N$ corresponding to different charge states (and, therefore, logical states) of the memory cells. The number of read offsets can be equal to the number of different charge states with each offset increasing with the bin index (e.g., with the ultimate bin M having the largest read offsets). At certain predetermined (e.g., based on the TVS functions) TAP, a memory partition can be shifted to the next bin, e.g., de-associated from bin j and associated with bin j+1, to reflect the estimated TVS of the memory cells of the partition.

A multitude factors and influences, however, can cause actual read offsets of a specific memory partition to deviate from the read offsets of a nominal bin with which the memory partition is currently (based on the elapsed time) associated. For example, the memory partition can be located on a die that was manufactured to a lower (higher) quality so that the memory cells of the die experience higher (lower) degree of TVS. A die can be subjected to abnormally high or low temperatures. The memory partition could have experienced a large number of erase cycles and are thus closer to the end of its working life. The adjacent memory partitions can have an abnormally large number of erase, program, and/or read operations causing a strong electrostatic interference with the memory partition. Many other factors can cause TVS to deviate from the anticipated (e.g., described by the TVS function) dependence making offsets of the bin associated based on the passage of time suboptimal and not fully reliable.

Aspects and embodiments of the present disclosure address this problem by disclosing resynchronization of bin associations to minimize errors in read operations. In some embodiments, the memory sub-system controller can initiate calibration of the memory subsystem to update the stored bin associations. The calibration can be initiated based on an occurrence of a triggering event, such as a significant change in the temperature of the memory sub-system, passage of a certain amount of time this the last synchronization, and so on. The amount of time can depend on the state of the physical memory partitions, such as the number of erase counts of the memory partitions. During calibration, the memory sub-system controller can select a family of memory partitions and choose (e.g., randomly) some of the memory partitions of the family for diagnostics, e.g., using a number of calibration operations. During diagnostics, the read operations can be performed using sets of read offsets that correspond to various bins, including the current bin (e.g., bin j) as well as other bins, including at least some of the "downstream" bins j+1, j+2, . . . that are associated with larger read offsets (than the read offsets of bin j). Because in some instances, the reference bin associations (e.g., determined on the basis of TVS functions) can overestimate the read offsets, the memory sub-system controller can also use the read offsets of the "upstream" bins j−1, j−2, . . . . The memory sub-system controller can obtain read error counts (e.g., bit error counts) for each of the tested bins/read offsets and select the target bin which minimizes read errors. The memory partition can then be associated with this target bin (provided that the target bin is different from the current bin).

Advantages of the systems and methods implemented in accordance with some embodiments of the present disclosure include, but are not limited to, improving performance of memory sub-systems by reducing the rate of errors in read operations caused by deviations of the actual TVS from nominal TVS that can be anticipated based on read statistics of similar memory devices determined during testing or manufacturing.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115, for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130, 140. The memory sub-system controller 115 can be responsible for other operations such as wear leveling operations, garbage collection operations, error detection and error-correcting code (ECC) operations, encryption operations, caching operations, and address translations between a logical address (e.g., logical block address LBA, zoned namespace) and a physical address (e.g., physical block address (PBA)) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130, such as folding, garbage collection, wear leveling, and the like). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a state synchronization component (SSC) 113 which can, responsive to detecting a power event, initiate calibration of various memory partitions of the memory sub-system 110 and update, based on the results of the calibration, the ARM, e.g. the family-bin associations of families of memory partitions of the memory sub-system 110, as described in more detail below. As part of the calibration, SSC 113 can perform random selection of memory partitions for calibration within the one or more memory devices 130, 140, conduct error correction analysis of read operations on the selected memory partitions, update the family-bin associations, store the updated associations in the metadata tables, and perform other tasks related to state synchronization. The metadata tables with ARM can be stored in the local memory 119 or in one or more memory devices 130, 140.

In some embodiments, the memory sub-system controller 115 includes at least a portion of the SSC 113. For example, the memory sub-system controller 115 can include a processor 117 (processing device) configured to execute instructions stored in local memory 119 for performing the operations described herein. In some embodiments, the SSC 113 is part of the host system 120, an application, or an operating system. In some embodiments, the SSC 113 can have configuration data, libraries, and other information stored in the memory device 130 (and/or the memory device 140).

Figure 2:
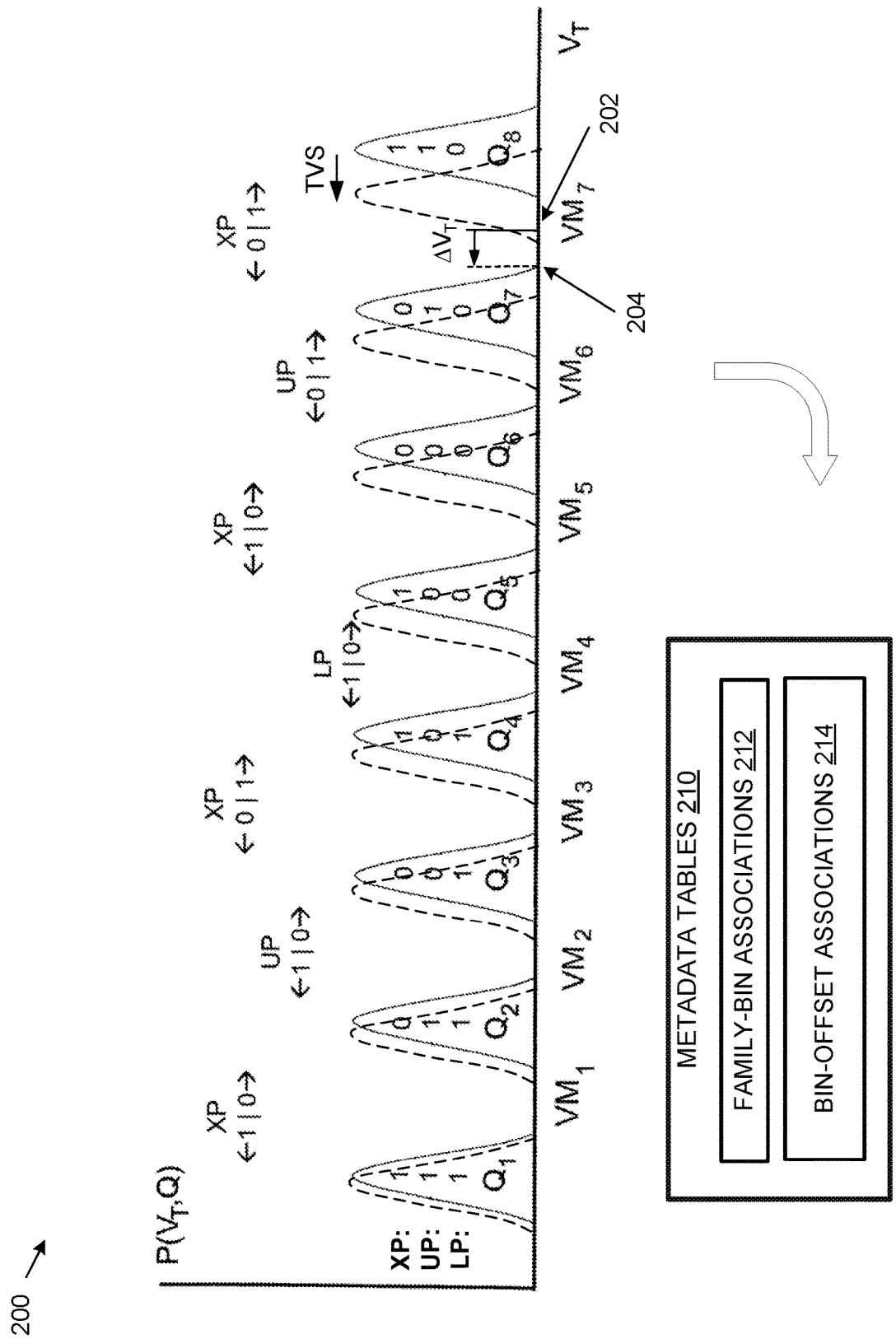
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

FIG. 2 illustrates schematically temporal voltage shift (TVS) of a three-level memory cell (TLC) capable of storing three bits of data by programming the memory cell into eight charge states $Q_k$ that differ by the amount of charge on the cell's floating gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). After three programming passes, a wordline of triple-level cells can store up to three pages: lower page (LP), upper page (UP), and extra page (XP). For example, upon the first programming pass, the cell can be driven to one of the charge states $Q_1, Q_2, Q_3, Q_4$ (corresponding to LP bit value 1, as shown in FIG. 2) or one of the charge states $Q_5, Q_6, Q_7, Q_8$ (corresponding to LP bit value 0). Upon the second path, when the UP is programmed into the same wordline, the charge state of the memory cell can be adjusted so that the range of possible locations of the cell's threshold voltage is further narrowed. For example, a cell that is in one of the charge states $Q_1, Q_2, Q_3$, or $Q_4$ (LP bit value 1) can be driven to just one of the two states $Q_1$ or $Q_2$ (corresponding to UP bit value 1), or to one of the two states $Q_3$ or $Q_4$ (corresponding to UP bit value 0). Similarly, upon the third programming path, the charge state of the memory cell can be fine-tuned even more. For example, a cell that is in the logic state 10 (i.e., UP bit stores value 1 and LP bit stores value 0) and is in one of the charge states $Q_7$ or $Q_8$ can be driven to state $Q_7$ (corresponding to XP bit value 0) or to state $Q_8$ (corresponding to XP bit value 1). Conversely, during a read operation, the memory controller 115 can determine that the applied control gate voltage $V_{CG}$ within the sixth valley margin $VM_6$ is insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For more reliable read operations, the controller 115 (or SSC 113) can, therefore, adjust the base read levels with the corresponding offsets $V_R \rightarrow V_R + \Delta V$, which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete number of voltage offsets $\Delta V$. In such embodiments, TVS phenomenon can be addressed with setting up a number of discrete bins, e.g., five, eight, twenty, etc., which can be indexed with a bin number j, e.g., j=0 . . . M. with various memory partitions to be associated with the bins. Generally, the more time has passed since programming of a specific memory partition, the higher the bin number j (and the respective read voltage offsets) with which the memory partition is to be associated. The bin-related data can be stored in the metadata tables 210. The associations of various memory partitions (which can be grouped into families, as described in more detail below) with bins can be stored in family-bin associations 212; the family-bin associations can dynamically change with the passage of time. For example, as the memory cells continue to lose charge with time, the respective memory partitions (grouped into families) can be moved, in a consecutive fashion, from junior bins (smaller bin numbers j) to more senior bins (larger bin numbers j) having larger voltage offsets. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations.

Figure 3:
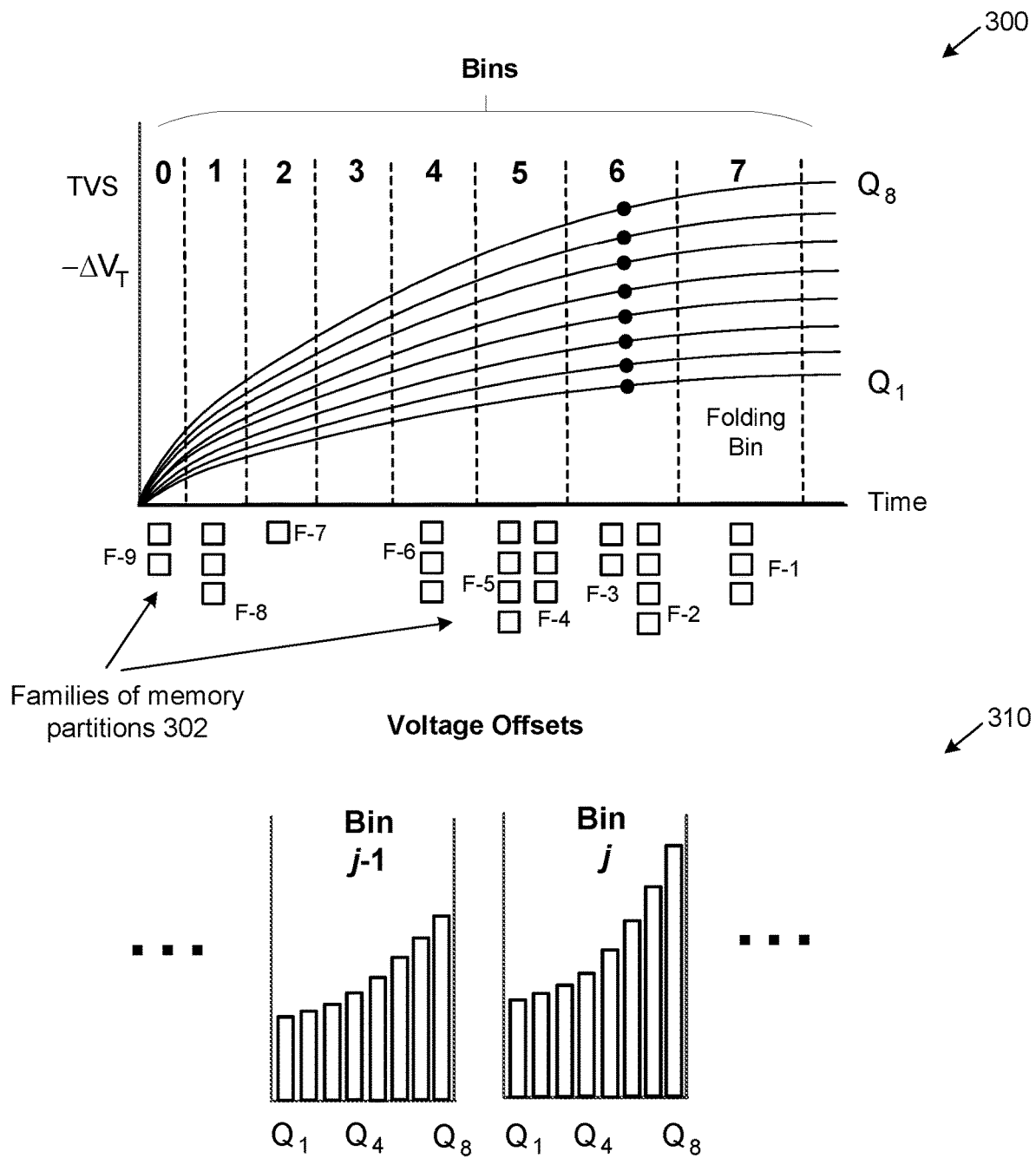
FIG. 3 illustrates schematically an exemplary auxiliary read metadata setup that includes family-bin associations and bin-offset associations, in accordance with some embodiments of the present disclosure.

FIG. 3 illustrates schematically an exemplary auxiliary metrics setup that includes family-bin associations 212 and bin-offset associations 214, in accordance with some embodiments of the present disclosure. Depicted in the top view 300 is a sketch of TVS for various charge states of a triple-level memory cell (from the lowest charge state $Q_1$ to the highest charge state $Q_8$). The depicted in the top view 300 curves can correspond to nominal (benchmark) TVS dependencies that can be determined via testing performed after manufacturing using the same type or similar devices. The number of bins and the read voltage offsets for each bin can be determined based on such testing. The number of bins can be determined from balancing the increased accuracy of threshold voltage corrections that the additional bins can provide against the need to allocate increased computational resources to maintain such additional bins and ensure a more frequent updating of the family-bin associations.

As illustrated in FIG. 3, the threshold voltages can change rapidly at first (immediately after the memory cell is programmed) but slow down with the time elapsed since programming. In some embodiments, the dependence on time of the voltage shift can be approximated with a power-law function $-\Delta V(t, Q_k) = C_k * t^b$ where different constants $C_k$ describe evolution of different charge states $Q_k$. In some embodiments, the exponent b can be the same for all charge states, while in other embodiments the exponent b can depend on the charge state, for added accuracy of representation. The evolution of the threshold voltage in the top view 300 can be delineated with a bin boundaries (dashed lines) defining a number of bins: 0, 1, 2 . . . M. The number of bins can be determined empirically, based on calibration of the memory device (or similar-type memory devices). The bin boundaries can be defined using various metrics. For example, the boundaries can be placed so that the voltage $V_T(t)$, or the voltage shift $\Delta V(t)$, change no more than a predetermined value (or a pre-determined percentage of the respective $V_T(t)$ or $\Delta V$) across the temporal width of the bin. In some embodiments, the bin boundaries can be placed at equal increments of the logarithm log $\Delta V(t)$, which is (approximately) a linear function of time. Practically unlimited number of possible ways to setup bins and bin boundaries can be envisioned by a person of ordinary skill in this technology.

A simultaneously programmed memory partition (e.g. block, plane, etc.) can evolve from bin 0 to bin 1 to bin 2 and so on, as a natural result of the charge loss. The number of bins can be sufficiently large so that whenever the memory partition is between two bin boundaries (e.g., inside bin 6), application of some fixed voltage offsets that are uniform across the bin (regardless of whether the memory partition is closer to the left bin boundary, the center of the bin, or the right bin boundary) should ensure an adequate read operation performance. The read voltage offset values can be defined as average voltage offset values across the temporal extent of the bin (indicated with black dots in bin 6), weighted averages, median values, and the like. In determining various average or medians, the voltage shifts $\Delta V(t)$ can be approximated with, e.g., a power-law fitting function, such as a measured benchmark function. In some embodiments, however, the read voltage offset values for various bins can be obtained empirically, without using the power-law (or any other) fitting function, as the values that maximize performance (e.g., as the values that minimize read errors).

The read voltage offset values can be specific to a given charge state. The bottom view 310 of FIG. 3 depicts schematically bin-offset associations using a pair of consecutive bins (bin j−1 and bin j) as an example. Each bin may have an associated read voltage offset for each charge state, from the lowest charge state $Q_1$ to the highest charge state $Q_N$ (depending on the number of bits stored in the memory cell). As the bin number increases (e.g., from j−1 to j), the respective voltage offsets (indicated by the respective vertical bars in the bottom view 310) can increase as well. In some embodiments, the bin-offset associations can store N separate values for each of the N charge states of the memory cells. In some embodiments, however, the bin-offset associations can instead store two or more parameters of an interpolation function $F(Q_0)$ that determines the value of the voltage offset $\Delta V = F(Q_k, j)$ for the charge state $Q_k$ of bin j.

In some embodiments, when memory partitions are programmed and grouped into families 302, the newly-created families are initially assigned to bin 0, which corresponds to minimal TVS. As depicted in FIG. 3, family F-9 having two partitions (e.g., two memory blocks), depicted by white squares, has just been programmed and associated with bin 0. As memory partitions "age" (with passage of time since programming), the respective families move to higher (more senior) bins—by being de-associated from more junior bins and associated with more senior bins. For example, family F-8 was programmed before F-9 and has already been moved to bin 1. Each bin can have an arbitrary number of families associated with it and each family can include an arbitrary number of memory partitions, depending on how fast controller 115 programs new partitions and how fast the environmental conditions (e.g., temperature) change. For example, bin 5 has two families (F-4 and F-5) while bin 3 currently has no families (e.g., controller 115 did not perform any programming between the time family F-6 was closed and the first partition of family F-7 was programmed).

A family is a set of memory partitions programmed within a certain pre-determined time interval while the environmental conditions remain approximately the same. A family closes after a passage of the pre-determined time interval since the family opens or upon an occurrence of a substantial change in the environmental condition, whichever happens earlier. The substantial change can be a change in temperature (e.g., since the time when the family is opened) above some positive temperature increment (e.g., 10 K or any other value) or below some negative temperature increment (e.g., −5K, −10K, or any other value).

With time, the families depicted in FIG. 3, can move to the right, being re-associated with consecutively more senior bins. In some embodiments, the subsequent bin re-assignment can be performed by SSC 113 upon the passage of pre-determined times (depicted with dashed lines in FIG. 3). In some embodiments, however, for added accuracy of family-bin associations, calibration or scanning (synchronization) can be performed. SSC 113 can perform calibration of some or all families by selecting (e.g. randomly) various memory partitions of the family being calibrated, selecting (e.g., randomly) multiple pages from the selected partitions, performing read operations on the selected pages while applying various read offsets corresponding to multiple bins, as described in more detail in relation to FIG. 4. As a result of such calibration, the family can be determined to be aging "normally," so that the detected voltage offsets approximately follow the average or typical time evolution (depicted in the top view 300) of the voltage offsets $\Delta V(t, Q_k)$. In such instances, the association of the family with its current bin j can be maintained. In other instances, however, it may be detected during calibration, that the family is aging faster than could be expected based on the average time evolution of the voltage offsets $\Delta V(t, Q_k)$ and that the current detected voltage offsets correspond to the next bin j+1 (or any of the subsequent bins, j+2,j+3, . . . etc.). In such instances, SSC 113 can move the family forward to the appropriate more senior bin. In yet other instances, it may be detected during calibration that the family is aging slower than could be expected based on the average time evolution of the voltage offsets. More specifically, the family could have been previously moved to bin j from bin j−1 without calibration, based on the passage of time. Yet, during the next calibration, the family can be detected having voltage offsets that correspond to bin j−1 (bin j−2, etc.) rather than to the current bin j. In such instances, the family can be moved upstream to the more junior bin j−1, j−2, etc. Faster or slower TVS can be predicated on more or less volatile environmental conditions, higher or lower quality of dies that host the memory partitions assigned to the family under calibration, or on various other conditions.

To address this non-uniformity of TVS for different memory partitions, SSC 113 can initiate calibration of family-bin associations at regular time intervals, after a significant change of the environmental conditions (temperature, humidity, etc.) happens, after a mechanical impact, after the memory sub-system 110 (or any of its memory devices 130, 140) is powered up, or after any other similar triggering event that can result in a change in the TVS dynamics. During calibration, SSC 113 can select a family of memory partitions and run a number of diagnostic tests (e.g., read operations) to identify a target bin with which the memory partitions of the selected family should be associated to achieve the best possible performance given the current physical state of the memory partitions.

Figure 4:
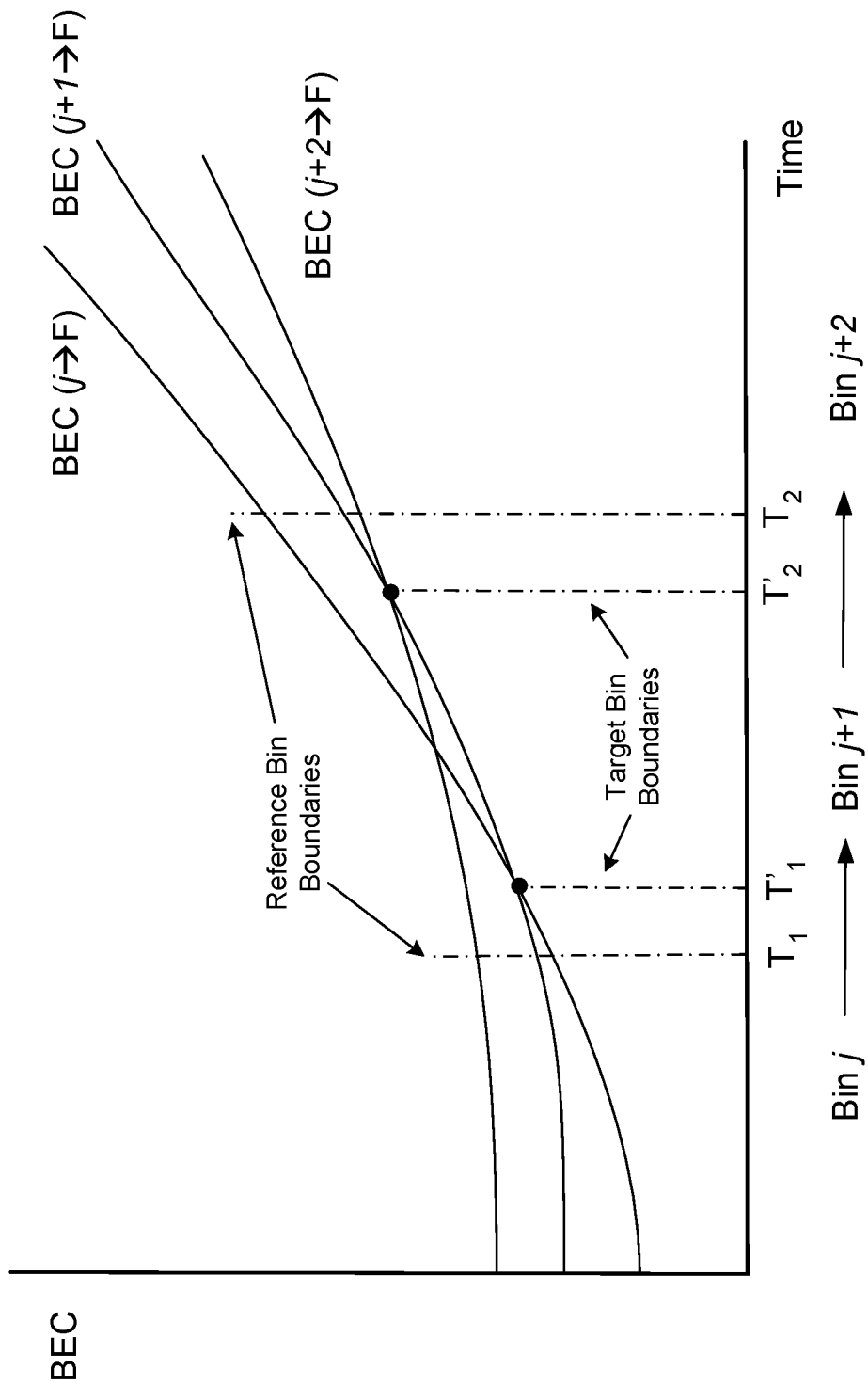
FIG. 4 illustrates schematically one exemplary method of tracking temporal voltage shift for use in calibration of state metrics of memory partitions of the memory sub-system, in accordance with some embodiments of the present disclosure.

FIG. 4 illustrates schematically one exemplary method of tracking temporal voltage shift for use in calibration of state metrics of memory partitions of the memory sub-system, in accordance with some embodiments of the present disclosure. In some embodiments, SSC 113 can perform tracking and calibration for some or all of the families of the memory device, e.g., following an occurrence of a triggering event. The triggering event may be global to the memory system, such as powering down or powering up the memory device. The triggering event can be specific to a part of the memory device (e.g., a temperature increase of a specific die), but can be the same for multiple memory partitions residing within the part of the memory device (e.g., on the same die). In some embodiments, the triggering event can be specific to the memory partition or to the family that includes the memory partition. For example, the triggering event can be a passage of time since the last calibration of the same family, e.g., the time that has elapsed since the commencement or completion of a previous calibration. The time between calibrations can vary depending on the physical state of the memory blocks (or other partitions associated with the family). For example, blocks that have already undergone many erase/program cycles and are, therefore, closer to the end of their resource life and tend to have greater TVS, can be calibrated more frequently, whereas blocks with fewer erase/program cycles can be calibrated less frequently. SSC 113 can track the time that has elapses since the programming of the memory partitions of each family and can have access to the number of erase/program cycles each memory partition has been programmed. Based on such information, SSC 113 can compute the time when the next calibration for each family is to be started and schedule the next calibration. In some embodiments, a supervening environmental, mechanical (e.g., impact), electrical (e.g., a power surge) or other similar event can trigger an earlier—than the scheduled—start of the calibration process.

At the start of the calibration, SSC 113 may select a family scheduled (or otherwise triggered) for calibration. Shown schematically in FIG. 4, is a set of calibration operations that can be performed to track and update a bin association for the selected family. SSC 113 can choose a number of partitions from the memory partitions associated with the selected family. For the sake of concreteness, it will be assumed that the memory partitions chosen for diagnostics are memory pages, although any other partitions can be chosen instead (such as fractions of pages, multiple pages, blocks, planes, dies, etc.). In some embodiments, the pages chosen for diagnostics are randomly picked by SSC 113 from various pages belonging to memory partitions of the selected family. In some embodiments, the pages chosen for diagnostics can be the oldest (or youngest) pages of the selected family.

SSC 113 can perform multiple sets of calibration operations on the chosen pages. For example, if the selected family is associated with bin j, SSC 113 can perform one set of calibration operations using read voltage offsets of bin j and determine a data state metric representative of how efficiently the read offsets of bin j address TVS of the memory cells of the respective memory pages. The calibration metric can be a bit error count (BEC) for the calibration operations performed on the chosen memory pages. SSC 113 can determine BEC using parity code error correction algorithms, Hamming code algorithms, Bose, Chaudhuri, and Hocquenghem (BCH) code algorithms, or any other error correction algorithms. The error correction algorithms can be single-error or multiple-error algorithms. Using one or more of the error correction codes, SSC 113 can determine BEC when bin j offsets are applied to amend the base read threshold voltages during read operation on the memory cells of the chosen memory pages. The curve BEC(j→F) illustrates schematically the diagnostic BEC (vertical axis), with bin j offsets being used, as a function of the time (horizontal axis) when the calibration operations are performed. Similarly, SSC 113 can perform additional sets of calibration operations using read offsets of other bins, such as bin j+1 (curve BEC(j+1→F)), bin j+2 (curve BEC (j+2→F)), j+3, and so on. In some embodiments, all bins (and all corresponding sets of read offsets) are applied during diagnostics. In some embodiments, the read offsets of the upstream bins j−1, j−2 . . . are not applied since the charge loss is generally an irreversible process.

In some embodiments, however, SSC 113 can also apply at least some of the upstream (e.g., j−1) bin offsets. For example, the calibration and diagnostics currently being performed can be a first (at least within some considerable time) diagnostics for the selected family, and the current bin association with bin j could have been established based on TVS functions and the passage of time rather than based on a previous diagnostics. In such instances, the current association with bin j can be in error as the memory partitions of the selected family could have experienced below average TVS in the meantime. For example, as indicated schematically in FIG. 4, according to the TVS function, a family is to be shifted from bin j to bin j+1 at time $T_1$ and further to be shifted from bin j+1 to bin j+2 at time $T_2$. However, the target shifting times (as explained in greater detail below) can be different, e g., can be times $T'_1$ and $T'_2$, respectively. Specifically, if the diagnostics is performed at a time t such that $T_1 < t < T'_1$, SSC 113 could have previously changed the association of the family from that with bin j to bin j+1, based on the passage of time. The family, however, could have been experiencing a slower charge loss than an average family would have and is still in the state where bin j offsets are optimal so that application of larger bin j+1 offsets would still be premature. To capture such slower-than-average TVS and to correct for premature assignment of families to more senior bins, SSC 113 can apply sets of read offsets for downstream as well as upstream bins.

In some embodiments, SSC 113 can perform all sets (each set utilizing read offsets of a separate bin) of calibration operations on the same chosen memory pages, for additional consistency of BEC results. In some embodiments, however, SSC 113 can make a new selection of the memory pages before a new plurality of read offsets is applied, to avoid disturbing, by repeated testing, the charge located on the same memory cells.

As indicated in FIG. 4, intersections of BEC curves corresponding to different bins (indicated by black circles) shows that at different times different sets of read offsets maximize read performance by ensuring the lowest number of read errors. For example, for times $t < T'_1$ bin j offsets ensure better performance, but at times $T'_1 < t < T'_2$ the better performance is achieved by offsets of bin j+1 (when smaller bin j offsets become insufficient). At the same time, the charge loss is not yet strong enough to justify higher offsets of bin j+2. This changes at $T'_2 < t$, where application of bin j+2 offsets results in the lowest BEC. Although error counts of only three bins are illustrated in FIG. 4 for clarity and conciseness, it should be understood that a picture similar to that in FIG. 4 applies to other bins as well. Correspondingly, each bin can have a time interval where the respective plurality of read offsets provides the maximum performance (minimum errors) during read operations.

Depending on where the time of diagnostics falls along the horizontal (time) axis of FIG. 4, one of two outcomes is possible: (1) the current bin association (e.g., bin j) of the selected family is confirmed, or (2) a different bin k (downstream or upstream) is identified as the target bin. In the first scenario, SSC 113 can maintain association with the current bin j. In the second scenario, SSC 113 can change the association of the family from the current bin j to the target bin j and can further update family-bin associations in the metadata tables 210. In some embodiments, the target bin k can be the last bin or any other bin, herein referred to as a media management (MM) bin for which the number of errors during read operations (even corrected with the respective read offsets) approaches a threshold level where error correction algorithms can no longer be capable of reliably recovering the information stored in the respective memory cells. Accordingly, when SSC 113 determines that the target bin k is the MM bin, SSC can schedule the memory partitions of the selected family for folding. Folding can involve copying the information currently stored in the memory partitions being folded to fresh memory partitions that have recently been erased. The old memory partitions can then be marked as invalid (and capable of storing new information after the erase operation is applied to them).

Figure 5A:
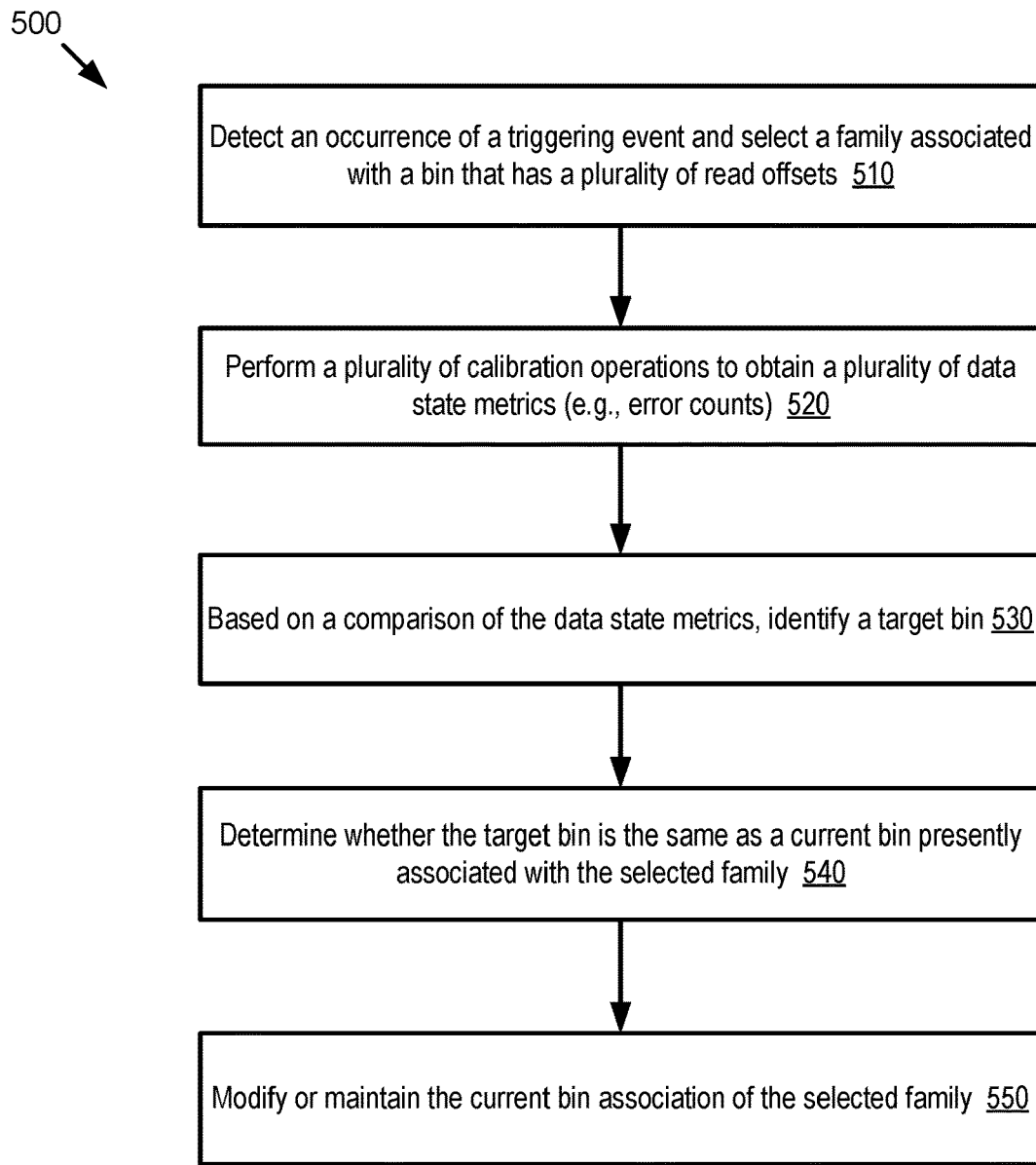
FIG. 5A illustrates a flow diagram depicting schematically an example method of tracking and refreshing state metrics of the memory sub-system, in accordance with some embodiments of the present disclosure
Figure 5B:
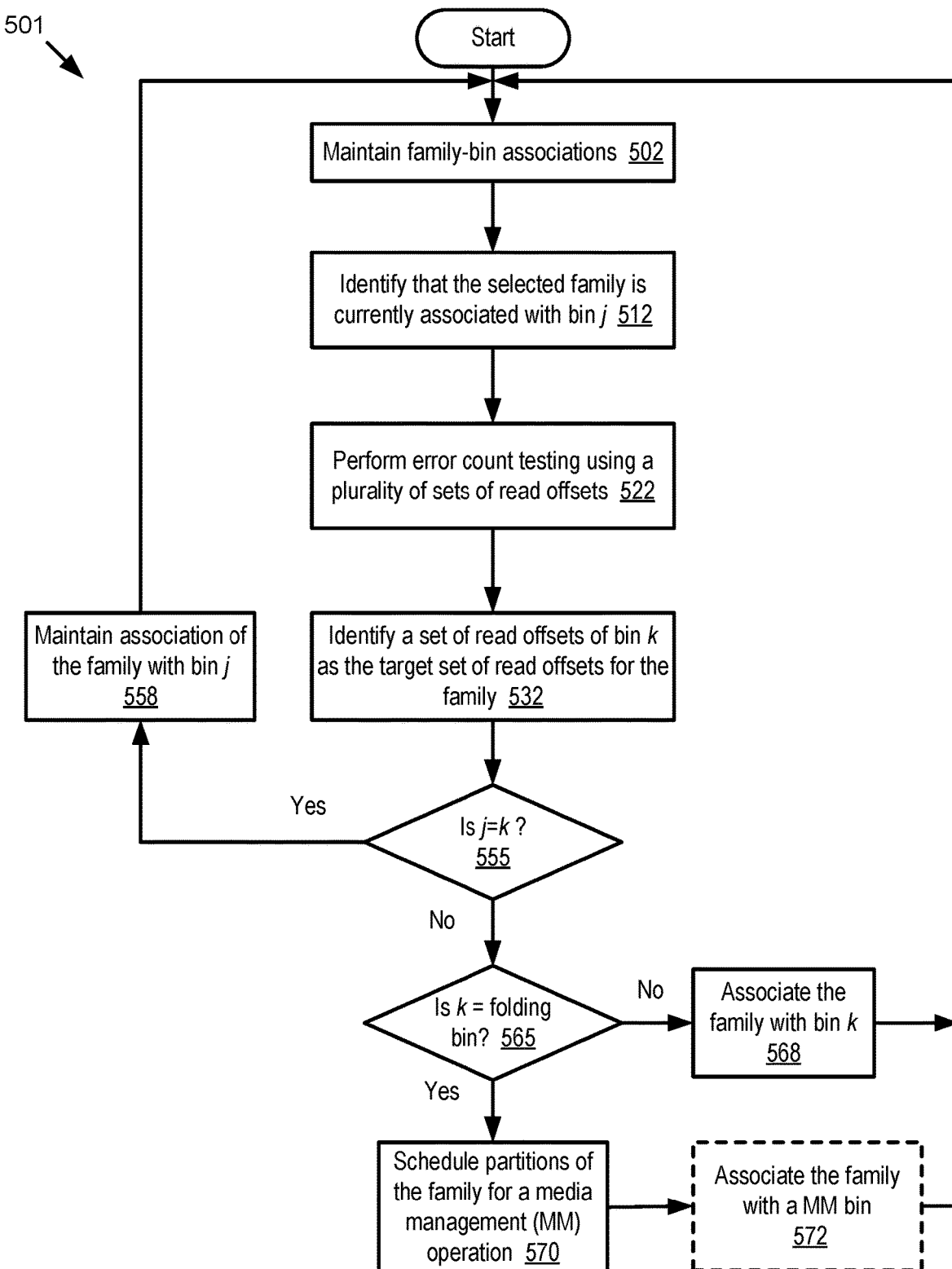
FIG. 5B illustrates one exemplary way of performing method of tracking and refreshing state metrics of the memory sub-system, in accordance with some embodiments of the present disclosure.

FIG. 5A illustrates a flow diagram depicting schematically an example method 500 of tracking and refreshing state metrics of the memory sub-system, in accordance with some embodiments of the present disclosure. Method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 500 is performed by SSC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. FIG. 5B illustrates one exemplary way 501 of performing method 500 of tracking and refreshing state metrics of the memory sub-system, in accordance with some embodiments of the present disclosure.

At operation 510 in FIG. 5A, a processing logic performing method 500 can detect an occurrence of a triggering event associated with a memory device. The processing logic performing method 500 (or a separate processing logic) can group memory partitions (e.g., blocks, pages, planes, etc.) of the memory device into families and maintain an association of each family (e.g., each family of blocks or, simply, block family) with a respective bin of a set of bins, as referenced by exemplary block 502 in FIG. 5B. Each bin can be associated with a plurality of read voltage offsets representing corrections to read signals applied to memory cells during read operations. A plurality of memory partitions (e.g., blocks or any other partitions) of the block family can be programmed by the memory sub-system controller 115 within a time interval not exceeding a threshold time after the family has been opened (e.g., by programming a first memory partition of the family). After the passage of the threshold time, the controller 115 can close the family and open the next family when the next programming operation is performed. A family can also be closed upon an occurrence of some environmental condition, such as a change in temperature that exceeds some (absolute or relative) value, upon a power event, or the like.

The processing logic can update from time to time—e.g., periodically or upon an occurrence of a triggering event— the family-bin associations. For example, based on reference times reflecting typical (e.g., average over many similar memory devices) rates of charge loss in memory cells, the processing logic can change associations of each or some of the families with one of the bins into an association with another (e.g., the next more senior) bin. Additionally, the processing logic can modify family-bin associations, responsive to an occurrence of a triggering event and upon performing various diagnostic and calibration operations. The triggering events include but are not limited to: a change in environmental conditions, a mechanical impact, a power down event, a power surge event, a passage of a first predetermined time since a time the memory partitions of the selected family were programmed, a passage of a second predetermined time since a time associated with a performance of prior diagnostic operations (for the same family), and the like. In some embodiments, the time associated with the performance of the prior diagnostic operations is one of (1) a time that has passed since a start of the prior diagnostic operations or (2) a time that has passed since a completion of the prior diagnostic operations, or some other time related to the prior diagnostic operations. In some embodiments, the time associated with the performance of the prior calibration operations can depend on a number of erase cycles associated with the family. For example, diagnostic operations can be performed the more (or less) frequently if the number of erase cycles associated with the family is higher (or lower). The number of erase cycles associated with the family can be an average number of erase cycles for the memory partitions of the family, a minimum number of erase cycles, a maximum number of erase cycles, a median number of erase cycles, and so on.

With continuing reference to operation 510 depicted in FIG. 5A, the processing logic performing method 500 can select, responsive to an occurrence of a triggering event, a family of memory blocks of the memory device. In some embodiments, as referenced by exemplary block 512 in FIG. 5B, the processing logic can identify (e.g., by accessing metadata tables 210) that the selected family is associated with one of a set of bins, e.g., bin j of M bins indexed with bin number 0 . . . M. Each bin can be associated with various read voltage offsets (corresponding to N different charge states of memory cells) representing corrections to read signals (base read voltages) applied to the memory cells during read operations. The read offsets can represent corrections to read signals used to compensate for a charge loss that has occurred since programming of the memory cells. The read offsets, generally, depend on the charge states of the memory cells with each of the N charge states being representative of one of N logical states of the memory cells and corresponding to specific data stored by the memory cells.

At operation 520 in FIG. 5A, the processing logic performing method 500 can perform, for one or more memory partitions of the selected family, a plurality of sets of calibration operations. In some embodiments, the one or more memory partitions are randomly chosen from the memory partitions of the selected family for diagnostics. For example, the processing logic can choose a portion (subset) of all memory blocks of the selected family (e.g., block family). Each set of the calibration operations can include obtaining a data state metric that corresponds to a respective one of the set of bins and can represent a number of errors detected responsive to applying the plurality of read offsets associated with the respective bin during calibration operations. In some embodiments, the data state metric is an error count value (e.g. BER value), which can be an average, a maximum, a weighted average, or some other value representative of the number of errors (e.g., bit errors) detected during calibration operations.

More specifically, as referenced by exemplary block 522 in FIG. 5B, the processing logic can perform a first set of calibration operations, including obtaining a first error count value that corresponds to a first bin (bin j) presently associated with the selected family and represents a number of errors detected when a first plurality of read offsets associated with the first bin is applied to the portion of memory blocks (or other memory partitions) chosen for diagnostics. The processing logic can further perform a second (third, fourth, etc.) set of calibration operations including obtaining a second (third, fourth, etc.) error count value that corresponds to a second (third, fourth, etc.) bin (e.g., bin j, bin j+1, bin j+2, etc.) and represents a number of errors detected when a second (third, fourth, etc.) plurality of read voltage offsets associated with the second (third, fourth, etc.) bin is applied. In some embodiments, the read voltage offsets associated with the second (third, fourth, etc.) bin can be larger than a respective read voltage offset associated with the first bin. For example, the read voltage offset for the logical state 011 associated with the second bin can be larger than the read voltage offset for the same logical state 011 associated with the first bin, and the read voltage offset for the same state associated with the third bin can be larger than the read voltage offset for the same state associated with the second bin, and so on.

At operation 530 in FIG. 5A, the processing logic performing method 500 can compare the obtained data state metrics (e.g., error count values) corresponding to the plurality of calibration operations to identify a target bin and determine that the data state metrics satisfy a predetermined condition, for example, whether the first data state metrics (e.g., the data state metric for the current bin j) is greater than the second state metrics (e.g., the data state metric for the target bin k). The target bin can be associated with a low (in some embodiment, a minimum) value of the obtained error count values. More specifically, as referenced by exemplary block 522 in FIG. 5B, the processing logic can identify bin k as the bin having the target plurality of read voltage offsets for the selected family. At operation 540 in FIG. 5A, the processing logic can determine whether the target bin is the same as the current bin presently associated with the selected family and, at operation 550, either modify or maintain the current association of the selected family with bin j. More specifically, with reference to exemplary decision-making block 555 in FIG. 5B, the processing logic can determine that the target bin k is the same as the current bin j presently associated with the selected family. Consequently, the processing logic, at exemplary block 558 can maintain association of the selected family with the current bin j.

If the processing logic determines, at the decision-making block 555 that the target bin k is different from the current bin j, the processing logic can determine, as indicated by another (optional) exemplary decision-making block 565, whether the target bin k is a medium management bin (MM bin), e.g., the last bin M, in one exemplary implementation). If the target bin is different from the MM bin, the processing logic can proceed to exemplary block 568 and change association of the selected family to an association with the target bin k. If, at the decision-making block 565, the processing logic determines that the target bin k is the MM bin, the method can continue to the exemplary block 570 and the processing logic can schedule at least some of the memory partitions of the selected family for media management. In some embodiments, the media management can include folding, garbage collection, wear leveling, and the like. For example, Folding operations can include copying information stored in the one or more memory partitions of the selected family to one or more new memory partitions of the (same or different) memory device. Because folding of the memory partitions can occur at some point in the future (rather than immediately after scheduling), it is possible that in the meantime the host system 120 can perform read operations directed to the memory partitions scheduled for folding. Accordingly, to facilitate efficient read operations, at optional exemplary block 572, the processing logic can associate the selected family with the MM bin so that whenever a read operation is performed on memory partitions of the family, the read offsets of the MM bin are applied. In some embodiments, the read offsets of the MM bin can be the largest offsets among the offsets of the bins maintained by SSC 113. The processing logic can also record, in metadata tables associated with the memory device, e.g., metadata tables 210, a timestamp associated with associating the selected family with the target bin (or with the MM bin).

Figure 6:
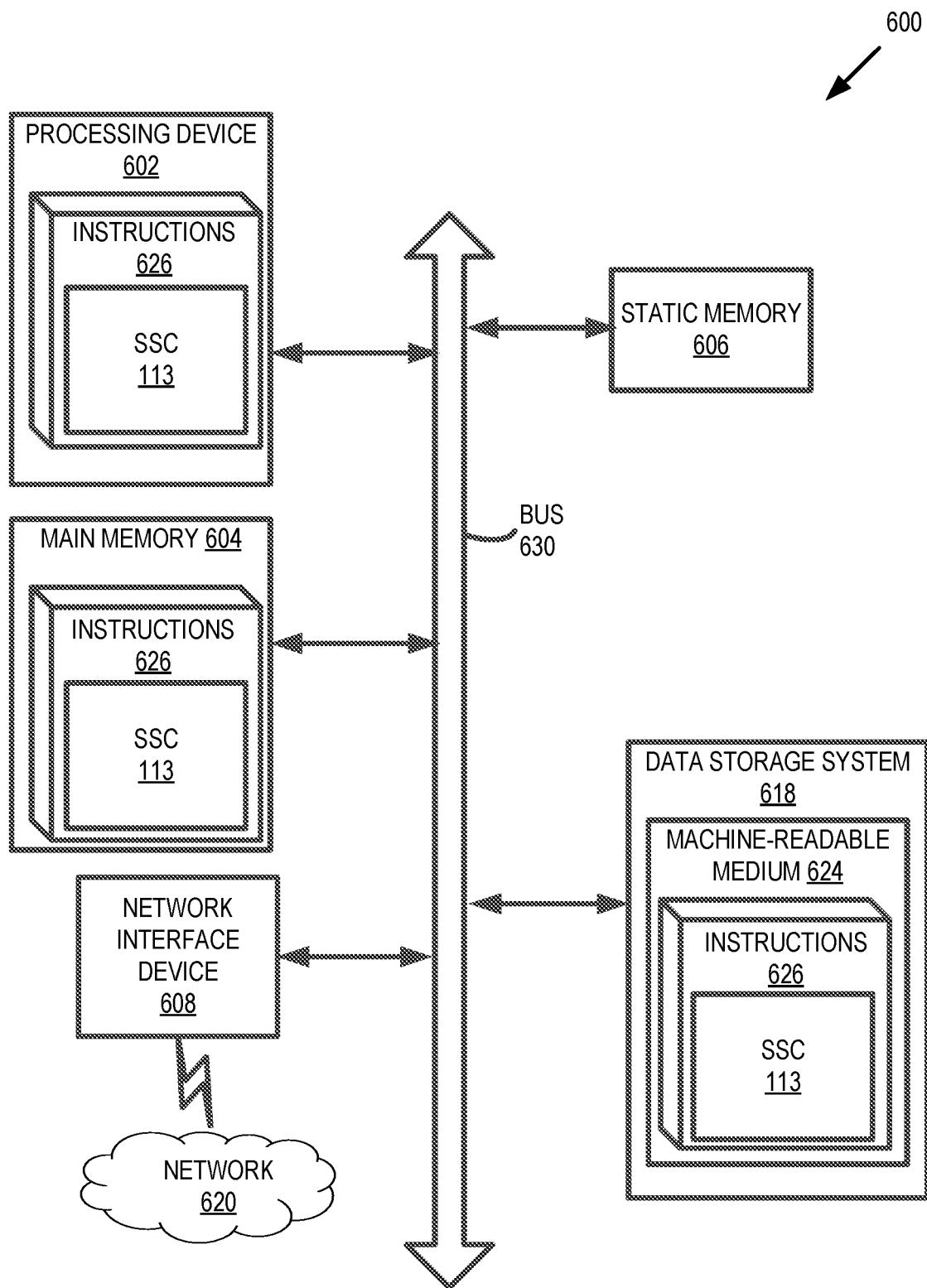
FIG. 6 a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the state synchronization component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a non-transitory computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one implementation, the instructions 626 include instructions to implement functionality corresponding to the state synchronization component 113 of FIG. 1. While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an implementation" or "one implementation" or the like throughout is not intended to mean the same implementation or implementation unless described as such. One or more implementations or implementations described herein may be combined in a particular implementation or implementation. The terms "first," "second," "third," "fourth," etc. as used herein are meant as labels to distinguish among different elements and may not necessarily have an ordinal meaning according to their numerical designation.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
responsive to detecting a triggering event, randomly selecting, from a subset of memory blocks of the memory device, a set of memory cells, wherein the subset of memory blocks is associated with a first bin of read voltage offsets (RVOs) of a plurality of bins of RVOs, and wherein the first bin of RVOs is associated with a first set of RVOs applied to memory cells during read operations;
applying, to the set of memory cells, a first set of calibration read operations using the first bin of RVOs;
applying, to the set of memory cells, a second set of calibration read operations using a second bin of RVOs of the plurality of bins of RVOs;
selecting, based on at least the first set of calibration read operations and the second set of calibration read operations, a target bin of RVOs from a group comprising the first bin of RVOs and the second bin of RVOs; and
associating the subset of memory blocks with the target bin of RVOs.

2. The system of claim 1, wherein the target bin of RVOs is the second bin of RVOs.

3. The system of claim 1, wherein applying the first set of calibration read operations comprises obtaining, using the first bin of RVOs, a first error count for the set of memory cells, and wherein applying the second set of calibration read operations comprises obtaining, using the second bin of RVOs, a second error count for the set of memory cells.

4. The system of claim 3, wherein the target bin is associated with a lesser of the first error count and the second error count.

5. The system of claim 1, wherein the operations further comprise:
 determining that the target bin is a last bin of the plurality of bins of RVOs; and
 copying data stored in the subset of memory blocks to one or more other memory blocks of the memory device.

6. The system of claim 1, wherein the triggering event comprises at least one of:
 passage of a first predetermined time since the subset of memory blocks was programmed; or
 passage of a second predetermined time since performance of a prior set of calibration operations.

7. The system of claim 1, wherein the subset of memory blocks was programmed within a time interval not exceeding a threshold time.

8. A memory device controller (MDC), configured to:
 responsive to detecting a triggering event, randomly select, from a subset of memory blocks of a memory device, a set of memory cells, wherein the subset of memory blocks is associated with a first bin of read voltage offsets (RVOs) of a plurality of bins of RVOs, and wherein the first bin of RVOs is associated with a first set of RVOs applied to memory cells during read operations;
 apply, to the set of memory cells, a first set of calibration operations using the first bin of RVOs;
 apply, to the set of memory cells, a second set of calibration operations using a second bin of RVOs of the plurality of bins of RVOs;
 select, based on at least the first set of calibration read operations and the second set of calibration read operations, a target bin of RVOs from a group comprising the first bin of RVOs and the second bin of RVOs; and
 associate the subset of memory blocks with the target bin of RVOs.

9. The MDC of claim 8, wherein the target bin of RVOs is the second bin of RVOs.

10. The MDC of claim 8, wherein to apply the first set of calibration read operations, the MDC is to obtain, using the first bin of RVOs, a first error count for the set of memory cells, wherein to apply the second set of calibration read operations, the MDC is to obtain, using the second bin of RVOs, a second error count for the set of memory cells, and wherein the target bin is associated with a lesser of the first error count and the second error count.

11. The MDC of claim 8, wherein the MDC is further configured to:
 determine that the target bin is a last bin of the plurality of bins of RVOs; and
 copy data stored in the subset of memory blocks to one or more other memory blocks of the memory device.

12. The MDC of claim 8, wherein the triggering event comprises at least one of:
 passage of a first predetermined time since the subset of memory blocks was programmed; or
 passage of a second predetermined time since performance of a prior set of calibration operations.

13. The MDC of claim 8, wherein the subset of memory blocks was programmed within a time interval not exceeding a threshold time.

14. A method comprising:
 responsive to detecting a triggering event, randomly selecting, from a subset of memory blocks of a memory device, a set of memory cells, wherein the subset of memory blocks is associated with a first bin of read voltage offsets (RVOs) of a plurality of bins of RVOs, and wherein the first bin of RVOs is associated with a first set of RVOs applied to memory cells during read operations;
 applying, to the set of memory cells, a first set of calibration read operations using the first bin of RVOs;
 applying, to the set of memory cells, a second set of calibration read operations using a second bin of RVOs of the plurality of bins of RVOs;
 selecting, based on at least the first set of calibration read operations and the second set of calibration read operations, a target bin of RVOs from a group comprising the first bin of RVOs and the second bin of RVOs; and
 associating the subset of memory blocks with the target bin of RVOs.

15. The method of claim 14, wherein the target bin of RVOs is the second bin of RVOs.

16. The method of claim 14, wherein applying the first set of calibration read operations comprises obtaining, using the first bin of RVOs, a first error count for the set of memory cells, and wherein applying the second set of calibration read operations comprises obtaining, using the second bin of RVOs, a second error count for the set of memory cells.

17. The method of claim 16, wherein the target bin is associated with a lesser of the first error count and the second error count.

18. The method of claim 14, further comprising:
 determining that the target bin is a last bin of the plurality of bins of RVOs; and
 copying data stored in the subset of memory blocks to one or more other memory blocks of the memory device.

19. The method of claim 14, wherein the triggering event comprises at least one of:
 passage of a first predetermined time since the subset of memory blocks was programmed; or
 passage of a second predetermined time since performance of a prior set of calibration operations.

20. The method of claim 14, wherein the subset of memory blocks was programmed within a time interval not exceeding a threshold time.

\* \* \* \* \*